US008917120B2

(12) United States Patent
Deboy (10) Patent No.: US 8,917,120 B2
(45) Date of Patent: Dec. 23, 2014

(54) SEMICONDUCTOR DEVICE HAVING A SWITCHABLE ELEMENT

(71) Applicant: Infineon Technologies AG, Neubiberg (DE)

(72) Inventor: Gerald Deboy, Klagenfurt (DE)

(73) Assignee: Infineon Technologies AG, Neubiberg (DE)

( * ) Notice: Subject to any disclaimer, the term of this patent is extended or adjusted under 35 U.S.C. 154(b) by 0 days.

(21) Appl. No.: 14/148,757

(22) Filed: Jan. 7, 2014

(65) Prior Publication Data
US 2014/0118051 A1    May 1, 2014

Related U.S. Application Data

(60) Continuation of application No. 13/799,641, filed on Mar. 13, 2013, now Pat. No. 8,643,406, which is a continuation of application No. 12/873,902, filed on Sep. 1, 2010, now Pat. No. 8,427,207, which is a division of application No. 12/036,823, filed on Feb. 25, 2008, now abandoned.

(51) Int. Cl.
*H03K 3/00* (2006.01)

(52) U.S. Cl.
USPC .......................................... 327/108; 327/112

(58) Field of Classification Search
USPC ..................................... 327/108, 112; 326/83
See application file for complete search history.

(56) References Cited

U.S. PATENT DOCUMENTS

| 4,553,082 | A | | 11/1985 | Nesler |
| 4,926,283 | A | | 5/1990 | Qualich |
| 5,422,593 | A | | 6/1995 | Fujihira |
| 5,751,180 | A | * | 5/1998 | D'Addeo ...................... 327/379 |
| 5,798,662 | A | * | 8/1998 | Marosek et al. ............... 327/109 |
| 5,936,439 | A | * | 8/1999 | Pollersbeck .................. 327/110 |
| 6,043,689 | A | * | 3/2000 | Sheets et al. .................. 327/108 |
| 8,643,406 | B2 | * | 2/2014 | Deboy .......................... 327/108 |
| 2001/0017783 | A1 | | 8/2001 | Bruckmann et al. |
| 2005/0024122 | A1 | | 2/2005 | Evers et al. |
| 2006/0038604 | A1 | | 2/2006 | Miske |
| 2008/0266727 | A1 | | 10/2008 | Merilinna |

FOREIGN PATENT DOCUMENTS

DE          4315738          11/1993

OTHER PUBLICATIONS

Office Action mailed Oct. 27, 2011 in U.S. Appl. No. 12/873,902.
Office Action mailed Sep. 30, 2010 in U.S. Appl. No. 12/873,902.
Office Action mailed May 29, 2013 in U.S. Appl. No. 13/799,641.

* cited by examiner

*Primary Examiner* — Kenneth B. Wells
(74) *Attorney, Agent, or Firm* — Dicke, Billig & Czaja, PLLC (57) ABSTRACT

A semiconductor device arrangement and a method. One embodiment includes at least one power transistor and at least one gate resistor located between a gate of the power transistor and a connecting point in the drive circuit of the power transistor. The semiconductor device arrangement includes a switchable element between the connecting point and a source of the power transistor.

2 Claims, 6 Drawing Sheets

| $T_H$ | H | G | Opt.1 | Opt.2 |
|---|---|---|---|---|
| turn-on | h | l | off | off |
| on-state | h | h | off | off |
| turn-off | l | h | on | on |
| off-state | l | l | on | off |

SEMICONDUCTOR DEVICE HAVING A SWITCHABLE ELEMENT

CROSS-REFERENCE TO RELATED APPLICATIONS

This Utility Patent application is a continuation application of U.S. application Ser. No. 13/799,641, filed Mar. 13, 2013, now U.S. Pat. No. 8,643,406, which is a continuation application of U.S. application Ser. No. 12/873,902, filed Sep. 1, 2010, now U.S. Pat. No. 8,427,207, which is a divisional application of U.S. application Ser. No. 12/036,823, filed Feb. 25, 2008, now abandoned; all of which are incorporated herein by reference.

BACKGROUND

This disclosure relates to a semiconductor device arrangement with at least one power transistor and at least one gate resistor, the power transistor having an extremely high switching speed owing to very low device capacitances. In the turn-off process, the so-called decommutation process, however, current and voltage overlap in the power transistor. To minimize any turn-off losses resulting from this, it is possible to turn off the channel current very fast by small external gate series resistors.

Turn-off losses can also be reduced by using the output capacitance Ca as a turn-off unloading capacitor. In this process, the load current commutates completely into the output capacitance Ca. As a result, the semiconductor device suffers virtually no heat losses in the turn-off process, but only a capacitive displacement current into the output capacitance Ca with an energy content $E_{Ca}$ of $$ECa = \int_0^{u_{DS}} Ca \cdot U \cdot dU \quad \text{(equation 1)}$$

wherein $u_{DS}$ represents the rising drain-source voltage in the turn-off process. From this can be derived the capacitive energy content of the semiconductor device in the off state at a voltage $U_{DS}$. This energy content can be minimized by reducing the value of the output capacitance Ca while reducing the size of the component.

In a switching process modified as described above by using the output capacitance Ca, the voltage increase during the turn-off process is however no longer controlled by the gate, but only by the load current $I_L$ to be disconnected. The voltage increase du/dt is determined by the load current $I_L$ in a linear manner and is inversely proportional to the output capacitance Ca with $$du/dt = I_L/Ca \quad \text{(equation 2)},$$

Wherein $I_L$ represents the load current and Ca represents the output capacitance of the power transistor.

By reducing the dimensions of the device, the output capacitance Ca is reduced to a very low value, so that at high current peaks the voltage increase du/dt reaches values which may significantly exceed the permissible breakdown voltage. Owing to the intrinsic structure of the semiconductor devices, the output capacitance Ca is voltage-dependent, so that, based on the above equation 2, the value of Ca changes as du/dt increases during the turn-off process. This change causes both a change of the capacitive displacement current for the output capacitance Ca and a change of the capacitive displacement current at the gate electrode.

In a non-linear condition, i.e. if there are parasitic inductances in the drive circuit, the change of the gate current induces a reverse voltage and may result in oscillations, in particular if the exciting voltage, is amplified by the power transistor. This results in an upper limit frequency via the charge of the input capacitance of the power transistor and the through-conductivity of the power transistor. In high-voltage devices, this may be significantly lower than the inherent resonance of the serial oscillator circuit made up of the drain-gate capacitance and the gate inductance. Oscillations during the turn-off process of such power transistors are undesirable, as they affect the EMC (electromagnetic compatibility) of the power transistor.

The fast and, with the aid of the output capacitance, nearly loss-free switching of power transistors is further limited by a very high current chopping in the power circuit. If the power transistor is turned off in a completely unloaded state, the load current completely commutates into the output capacitance Ca. In this process, the gate voltage may fall below the Miller plateau at full load current and even be reduced to zero. The Miller plateau is the potential at the insulated gate which still ensures that the channel of a field effect power transistor remains open.

If the power transistor as a switch reaches the externally preset link voltage, the switch can supply the load current. The di/dt resulting from this will cause a voltage reduction at the power transistor via the existing source inductances and, if the gate potential remains constant, contribute to an effective biasing of the channel. It has however been found that, owing to the capacitive coupling between gate and source, the gate potential follows a steep voltage reduction to source, resulting on the one hand in an incomplete biasing of the channel and on the other hand in an excessively high voltage amplitude at the gate.

In combination with the gate inductances, the rapid voltage change at the gate due to the capacitive coupling between gate and source also excites undesirable oscillations. Both effects are due to the inductances existing in a power transistor between the control electrode and a switching electrode. Such inductances are built up by the conductor routing to the gate connections of the power transistor within the semiconductor device and in part by the connecting elements forming induction loops between external contacts of the semiconductor device arrangement and the internal contact surfaces on the semiconductor chip of the power transistor.

For these and other reasons, there is a need for the present invention.

SUMMARY

One embodiment provides a semiconductor device arrangement with at least one power transistor and at least one gate resistor located between a gate connection and a connecting point, wherein a further switchable element is provided between the connecting point and the source of the power transistor. There are parasitic inductances between the connecting point and the source of the power transistor. The switchable element is located between the connecting point and the source of the power transistor and at steep switching edges bridges the inductances between the connecting point and the source.

BRIEF DESCRIPTION OF THE DRAWINGS

The accompanying drawings are included to provide a further understanding of embodiments and are incorporated in and constitute a part of this specification. The drawings illustrate embodiments and together with the description serve to explain principles of embodiments. Other embodiments and many of the intended advantages of embodiments will be readily appreciated as they become better understood by reference to the following detailed description. The elements of the drawings are not necessarily to scale relative to each other. Like reference numerals designate corresponding similar parts.

DETAILED DESCRIPTION

In the following Detailed Description, reference is made to the accompanying drawings, which form a part hereof, and in which is shown by way of illustration specific embodiments in which the invention may be practiced. In this regard, directional terminology, such as "top," "bottom," "front," "back," "leading," "trailing," etc., is used with reference to the orientation of the Figure(s) being described. Because components of embodiments can be positioned in a number of different orientations, the directional terminology is used for purposes of illustration and is in no way limiting. It is to be understood that other embodiments may be utilized and structural or logical changes may be made without departing from the scope of the present invention. The following detailed description, therefore, is not to be taken in a limiting sense, and the scope of the present invention is defined by the appended claims.

It is to be understood that the features of the various exemplary embodiments described herein may be combined with each other, unless specifically noted otherwise.

Figure 1:
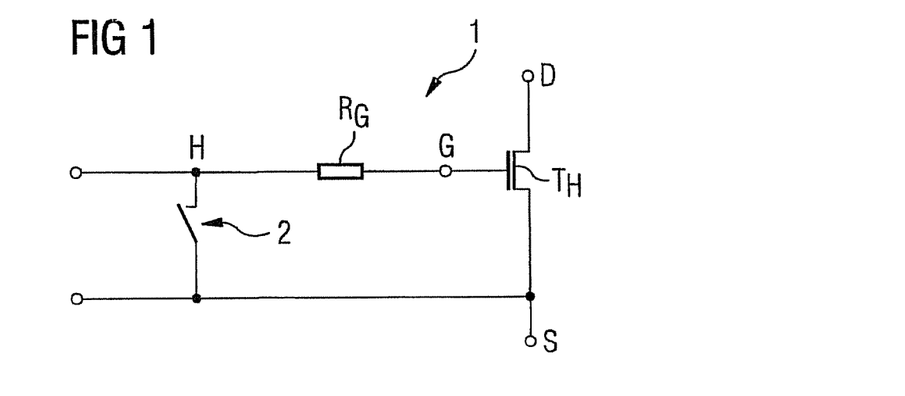
FIG. 1 illustrates the principal layout of one embodiment.

FIG. 1 illustrates a principal layout of one embodiment. This circuit includes a semiconductor device arrangement 1 with a power transistor $T_H$ and a gate resistor $R_G$ located between a gate G of the power transistor $T_H$ and a connecting point H in a drive circuit of the power transistor $T_H$. A switchable element 2 is provided between the connecting point H and a source S of the power transistor $T_H$. This switchable element 2 is configured such that it meets the requirements of the Boolean truth table illustrated in FIG. 2.

Figure 2:
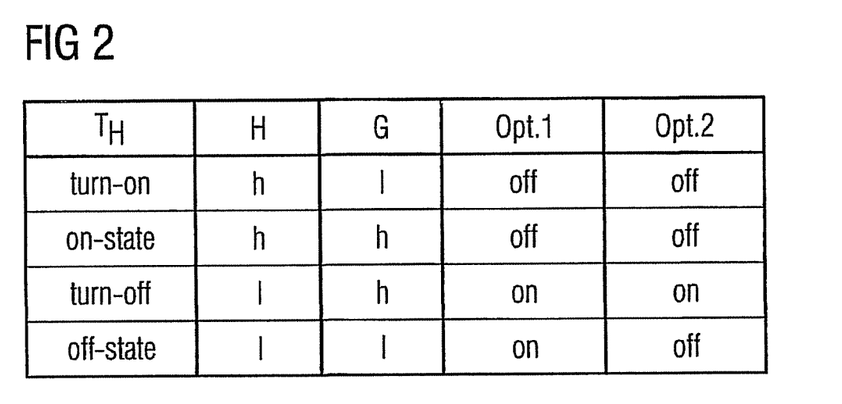
FIG. 2 illustrates a Boolean truth table explaining the switching function of a switchable element.

FIG. 2 is a Boolean truth table explaining the switching function of the switchable element 2 according to FIG. 1. The left-hand column of the Boolean truth table lists states or phases of the power transistor $T_H$. The second column lists the voltage values of the connecting point H, with h being high and l being low. The third column lists the corresponding conditions at the gate G of the power transistor $T_H$, likewise with h being high and l being low. The fourth column finally lists the switching states of the switchable element for a first option, wherein the switchable element is switched on both in the turn-off phase and in the off state of the power transistor $T_H$. The fourth column also illustrates a second option, wherein the switchable element 2 from FIG. 1 only completes the circuit in the turn-off phase of the power transistor $T_H$, connecting the connecting point H to the source S of the power transistor $T_H$.

Figure 3:
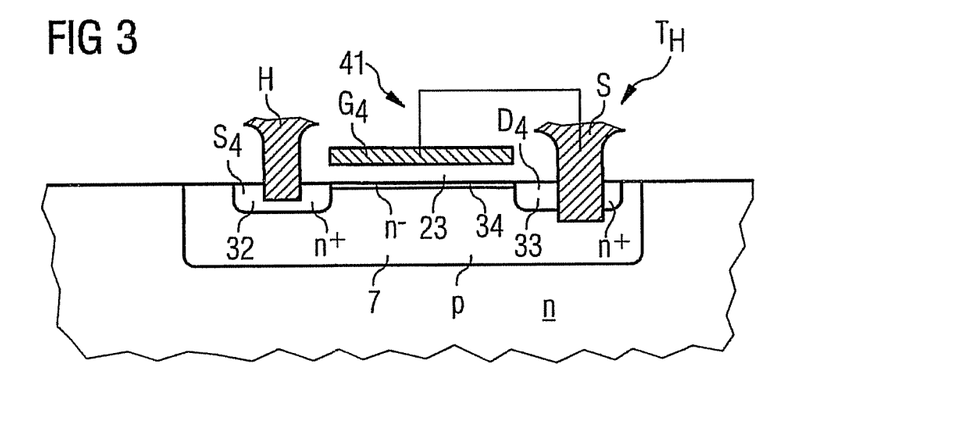
FIG. 3 illustrates a diagrammatic cross-section through a switchable element according to one embodiment.

FIG. 3 is a diagrammatic cross-section through a switchable element according to one embodiment. This switchable element is suitable for option 1 of the Boolean truth table according to FIG. 2. For this purpose, the switchable element has been integrated into the body zone 7 of the power transistor $T_H$ as an n-type depletion MOSFET 41.

For this purpose, a highly doped $n^+$-type zone 32 is introduced into the body zone 7 of the power transistor $T_H$, and this $n^+$-type zone 32 is contacted by the connecting point H according to FIG. 1. Between this $n^+$-type zone 32 with the contact H and an $n^+$-type source zone 33 of the source S of the power transistor $T_H$, a lightly doped $n^-$-type near surface zone is implanted as a depletion channel 34. This near-surface zone of a depletion channel 34 is controlled by a gate $G_4$ at source potential of the power transistor.

With this structure according to FIG. 3, an n-type depletion MOSFET is obtained in the body zone 7 of the power transistor $T_H$, which represents the switchable element 2 of FIG. 1 and corresponds to option 2 of the Boolean truth table according to FIG. 2. This function may for example be obtained by ensuring that the n-type depletion channel MOSFET has a negative threshold voltage which is less than $V_{th}$ of the power transistor $T_H$ with the configuration: source contact $S_4$ of the switchable element at H, gate contact $G_4$ of the switchable element at S of the power transistor $T_H$ and drain contact $D_4$ of the switchable element at source potential. In this way, the depletion MOSFET switches off automatically as soon as the connecting point H exceeds the negative threshold voltage $V_{th}$ of the depletion MOSFET 41.

When integrating the switchable element into the power transistor $T_H$ according to FIG. 3, is has to be taken into account that the p-n junction between the body zone 7 of the power transistor $T_H$ and the $n^+$-type zone 32 contacted by the connecting point H can absorb a reverse voltage of approximately 15 V, so that the limit imposed by Zener breakdown of the p-n junction is only reached at this reverse voltage. In addition, the source S of the power transistor $T_H$ contacts both the p-type body zone 7 and the $n^+$-type source zone 33, while the gate electrode $G_4$ of the switchable element is at source potential of the power transistor $T_H$.

Figure 4:
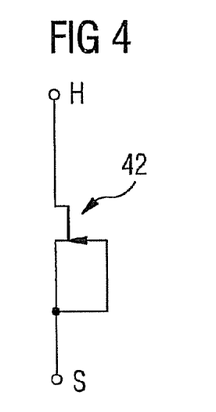
FIG. 4 illustrates a principal configuration according to one embodiment.

FIG. 4 illustrates a principal configuration according to one embodiment. In this configuration, the switchable element is likewise integrated into a body zone of the power transistor and designed as a junction field effect transistor 42. With a configuration of this type, the first option of the Boolean truth table from FIG. 2 can be implemented according to column 5.

Figure 5:
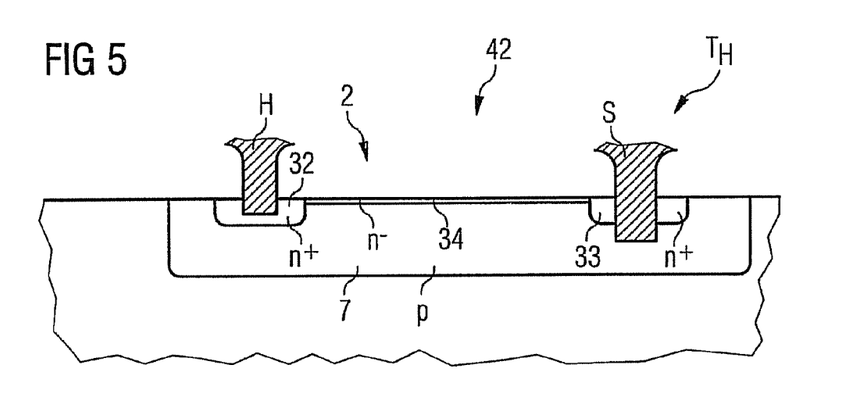
FIG. 5 illustrates is a diagrammatic cross-section through a switchable element according to one embodiment.

FIG. 5 is a diagrammatic cross-section through a switchable element 2 according to one embodiment. The cross-section corresponds to the embodiment illustrated in FIG. 3, but owing to a very shallow n-implantation near the surface of the body zone 7 of the power transistor $T_H$, there is no need for an additional gate connection $G_4$ as illustrated in FIG. 3. As soon as H, during the turn-off process because of the external control component or a gate driver, converges from a positive voltage to 0 V, the lightly doped depletion channel 34 becomes conducting and H therefore stops at source potential. Conversely, the channel goes into a pinch-off state during the turn-on process, as soon as H goes to a positive voltage relative to the p-well contacted by the source. The next figure illustrates the implementation of such an integration of a switchable element as JFET 42 into the body zone 7 of the power transistor $T_H$.

Figure 6:
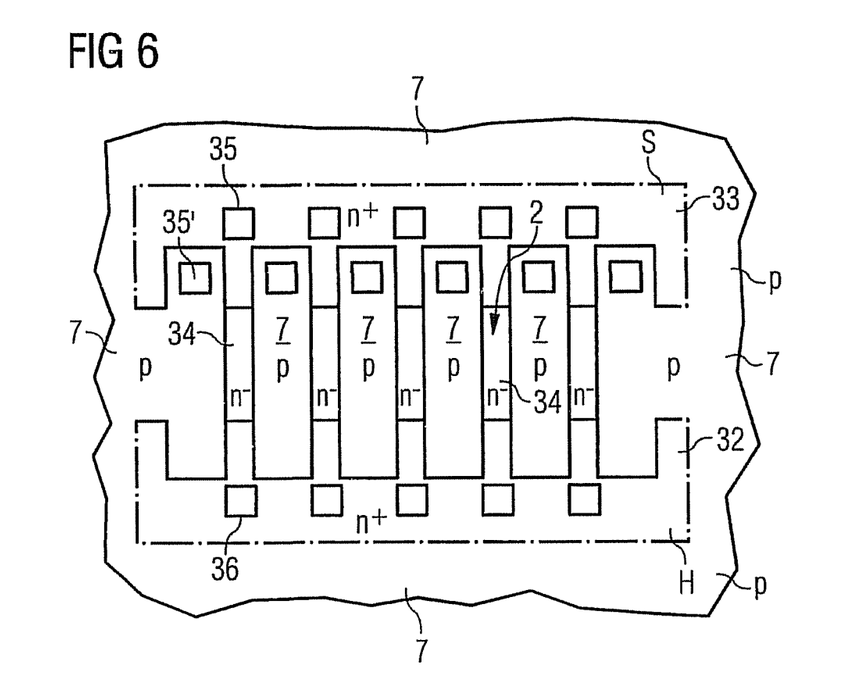
FIG. 6 illustrates a diagrammatic top view of the switchable element according to FIG. 5.

FIG. 6 is a diagrammatic top view of the switchable element 2 according to FIG. 5. To make the structure more clearly visible, the metallization has been omitted. This top view illustrates a section of the p-type body zone 7 of the power semiconductor, the $n^+$-type source zone 33 in the upper region being bounded by a broken line. Individual contact holes 35 establish the contact with the source metallization not illustrated in the drawing, and the shallow $n^-$-type implantation zone between the source zone S and the connecting point H is represented by individual strips extending from the $n^+$-type zone 33 to the $n^+$-type zone 32 of the connecting point H.

Contact holes 36 are also provided on the side of the connecting point H to establish a connection between the metallization of the connecting point H and the $n^+$-type zone located below. The wider stripes illustrated in FIG. 6 are related to the p-type body zone 7 of the power transistor and are connected to the source metallization via further contact holes 35'. This JFET structure allows for a self-cutoff characteristic, wherein in the p-type well 7 of the body zone of the power transistor, between the source S and the connecting point H, a shallow n-type implantation is introduced which, as mentioned above, is quickly depleted by the RESURF effect of the p-type well 7 located below, as soon as the connecting point H is once again restored to a voltage which may be below the threshold voltage of the power transistor.

This $n^-$-type region connecting S and H is depleted by the small lateral p-type strips connected to S as illustrated in FIG. 6. The embodiments illustrated in FIGS. 5 and 6 are subject to the condition that the n-p junction from the $n^-$-type region of the connecting point H to the surrounding p-type well 7 of the power transistor has to be designed for a reverse voltage capability which corresponds at least to the maximum permissible gate voltage of the power transistor.

Figure 7:
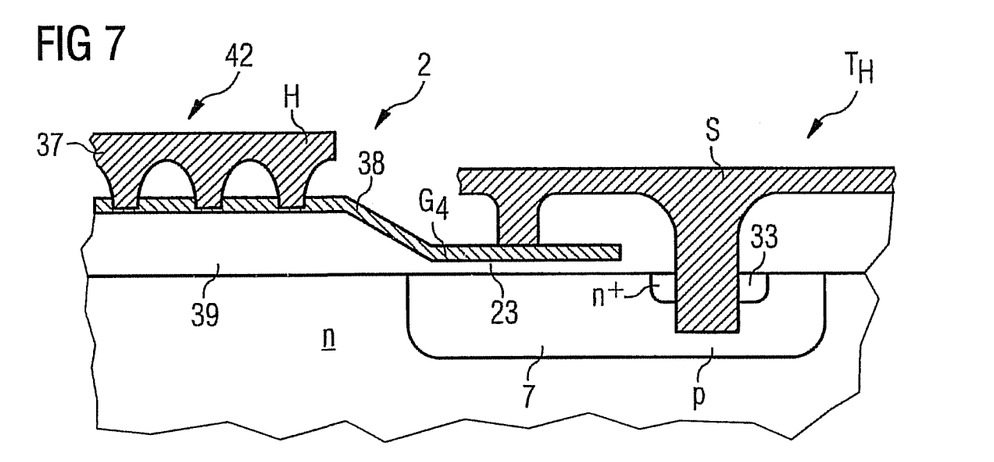
FIG. 7 illustrates a diagrammatic cross-section through a switchable element according to one embodiment.

FIG. 7 is a diagrammatic cross-section through a switchable element 2 according to one embodiment. In this case, the switchable element 2 is integrated as JFET 42 into the gate electrode structure. For this purpose, the metallization of the connecting point H is bonded to the polysilicon of the gate supply lines through vias 37 as illustrated in FIG. 7. The gate resistor $R_G$ as illustrated in FIG. 1 can be created by suitable meander structures of the polysilicon line 38. At the same time, but separate from this line to the gate resistor, the gate $G_4$ of a JFET structure, which is electrically connected to the source S of the power transistor $T_H$, can be contacted.

For this purpose, the gate resistor $R_G$ between the connecting point H and the gate G of the power transistor $T_H$ is ideally designed as an integrated gate resistor. As illustrated in FIG. 7, a connection to the connecting point H is established using a gate bond, so that the gate poly located below can be contacted from this point and meander to the gate of the power transistor $T_H$, from where it is routed into the gate ring and the rest of the gate electrode not illustrated in the drawing.

If a JFET 42 is to be integrated towards the source, a contact has to be established between the gate poly and the source S, which, as illustrated in FIG. 7, can be produced on a gate oxide 23 or on a field oxide 39. This however requires the separation of the gate poly around the source contacts illustrated in FIG. 6, as there would otherwise be a short circuit to the gate electrode, which would prevent the switching-on of the transistor. In other words, the source S contacts a small piece of the n-p poly material separated from the rest of the gate electrode and only connected to the rest of the n-type gate poly structure via the JFET 42.

Figure 8:
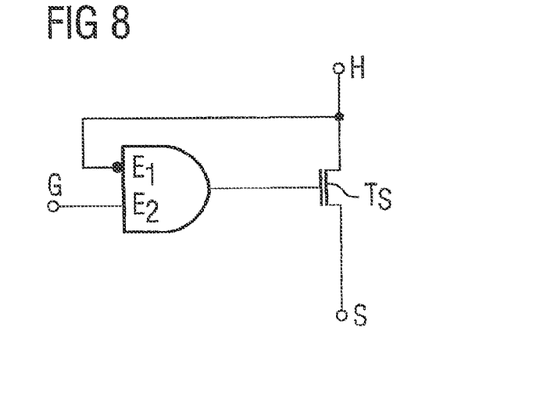
FIG. 8 illustrates the principal layout of one embodiment.

FIG. 8 illustrates switchable elements for the implementation of option 2 in column 5 of the Boolean truth table according to FIG. 2. As the connecting point H has not only to be held at source potential in the turn-off phase of the power transistor, but this bridge also has to be maintained in the off state, an additional switching transistor $T_S$ is used to take over the function of the switchable element according to FIG. 1; this may for example be installed into a control IC for the power transistor.

FIG. 8 illustrates the layout of a further one embodiment of the invention, wherein the switching transistor $T_S$ is driven by an AND gate with an inverted input E1. The signals required for this purpose may for example be generated by a control IC, which offers particular advantages if the power transistor is at least partially designed as a package together with a part of the drive circuit or with the whole control IC.

Figure 9:
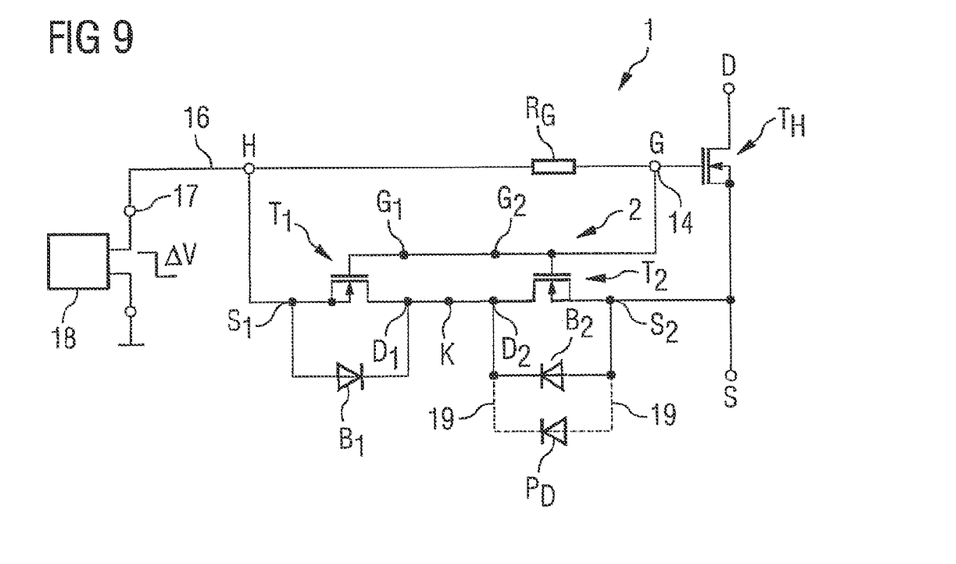
FIG. 9 illustrates a principal equivalent circuit diagram of a semiconductor device arrangement according to one embodiment.

FIG. 9 is an equivalent circuit diagram of a semiconductor device arrangement 1 according to one embodiment. The semiconductor device arrangement 1 includes a power transistor $T_H$, which may for example be used in a half bridge circuit as a low side switch (LSS). This power transistor $T_H$ has a gate connection 14 as a gate G of a semiconductor chip. Between the gate connection 14 and the connecting point H, such semiconductor device arrangements are provided with a gate resistor $R_G$, across which a voltage differential builds up while the insulated gate is loaded or unloaded. The gate is loaded or unloaded via a control line 16 connecting the connecting point H to the output 17 of a driver circuit 18.

The power transistor $T_H$ further includes a drain D, which may for example be at the potential to be switched, and a source S, which approximately adopts the potential to be switched as the power transistor $T_H$ switches through. When the power transistor $T_H$ switches off, the source S is reset to its low starting potential. Owing to a capacitive coupling between the gate G and the source S, the gate potential follows the source potential by using capacitive displacement currents, in one embodiment a turn-off phase, when the driver output 17 applies a turn-off signal ΔV to the connecting point H. In order to suppress any oscillation in this turn-off phase, a switchable element 2 is located between the connecting point H and the source S; this is controlled via a gate connection 14 and uses the voltage differential across the gate resistor $R_G$ to bridge any parasitic inductances present in the main transistor $T_H$ between gate and source in the turn-off phase.

As a result, the parasitic inductances are virtually short-circuited in the turn-off phase of the power transistor $T_H$ and oscillations are suppressed without increasing switching losses and without affecting the switching speed of the power transistor $T_H$.

For this purpose, the switchable element 2 according to one embodiment illustrated in FIG. 9 includes two n-channel MOS transistors $T_1$ and $T_2$ with body diodes B1 and B2 which block anti-serially, with the result that the parasitic inductances between the connecting point H and a source S are bridged as the gates $G_1$ and $G_2$ are triggered only in the turn-off phase at a suitable voltage differential across the gate resistor $R_G$. The gates $G_1$ and $G_2$ of the transistors $T_1$ and $T_2$ are for this purpose connected to the gate G of the power transistor $T_H$.

The drains D1 and D2 of the transistors $T_1$ and $T_2$ form a switching node K. The source S1 of the first transistor $T_1$ is connected to the connecting point H, while the source S2 of the second transistor $T_2$ is electrically connected to the source S of the power transistor $T_H$. Any oscillations caused by parasitic inductances between the connecting point H and the source S of the power transistor $T_H$ are thereby prevented. For this purpose, the connecting point H is electrically connected to the switching node K via the first body diode B1, while the source S of the power transistor $T_H$ is electrically connected to the switching node K via the body diode B2 of the second transistor $T_2$ of the switchable element 2.

A method for the production of a semiconductor device arrangement 1 with a switchable element 2 in the drive circuit includes the following process steps. First, a power transistor $T_H$ with parasitic inductances between a connecting point H and a source S and a gate resistor $R_G$ between the connecting point H and a gate G of the power transistor $T_H$ is provided. A switchable element 2 is then produced to bridge the inductances between the connecting point H and the source S in the turn-off phase of the power transistor at a steep switching edge $\Delta V$. To produce a switching element 2 operating like this, a first and a second n-type channel MOSFET $T_1$ and $T_2$ are first produced in a semiconductor body 12 with a common gate $G_{1,2}$ and a common drain $D_{1,2}$, their first and second body diodes $B_1$ and $B_2$ being anti-serially connected to one another.

The common gate $G_{1,2}$ can now be connected to the gate G of the power transistor $T_H$, the first source S1 of the first MOSFET $T_1$ can be connected to the connecting point H and the second source S2 of the second MOSFET $T_2$ can be connected to the source S of the power transistor $T_H$. If the power transistor $T_H$ is a lateral FET, the first and second n-channel MOSFETs $T_1$ and $T_2$ can be monolithically integrated into the semiconductor body 12 of this FET.

In power transistors $T_H$ with a vertical FET structure, a separate semiconductor device is produced as a switching element 2, its metallization 29 on the back side 4 being mounted on the source S of the power transistor $T_H$ in the form of a stacked semiconductor chip 13. In this case, the switchable element 2 supports on a p-type substrate 5 the first and second n-channel MOSFETs $T_1$ and $T_2$, the common drain $D_{1,2}$ of which, which consists of a n-type semiconductor material 8, being grown epitaxially on the substrate 5. The p-n junction 3 between the p-type substrate 5 and the n-type drain region 15 of the transistors $T_1$ and $T_2$ forms a large-area diode $P_D$ connected in parallel to the second body diode $B_2$.

This advantageously creates a MOS device which conductively connects the connecting point H upstream of an internal or external gate resistor $R_G$ to the source S of the semiconductor device arrangement 1. Ideally, the voltage drop across the gate resistor $R_G$, which results from the difference between the Miller plateau and the reference voltage of the gate control, is utilized. If the switching process is completely load-free and di/dt is limited via the source inductance, this switch does not become active, because the switchable element 2 between the source S of the power transistor $T_H$ and the connecting point H opens as soon as the voltage at the gate G drops below the Miller plateau. This drop below the Miller plateau occurs if the threshold voltage of the switchable element 2 equals that of the power transistor $T_H$.

IA slightly lower value for the threshold voltage of the switchable element 2, can be selected in order to allow a reliable closing of the switchable element 2 at the Miller plateau. Such a configuration would noticeably pull the connecting point H upstream of the gate resistor $R_G$ to source potential at the start of the turn-off process, when the input capacitance is discharged to the level of the Miller plateau. It would then remain at source potential during the entire turn-off phase without blocking an effective limitation of di/dt via the source inductance. Implementation in the semiconductor body 12 is based on the modification of the production masks, the gate structure level, the metal level and the contact hole level. At the end, only one additional level is required for masking the body contact.

Figure 10:
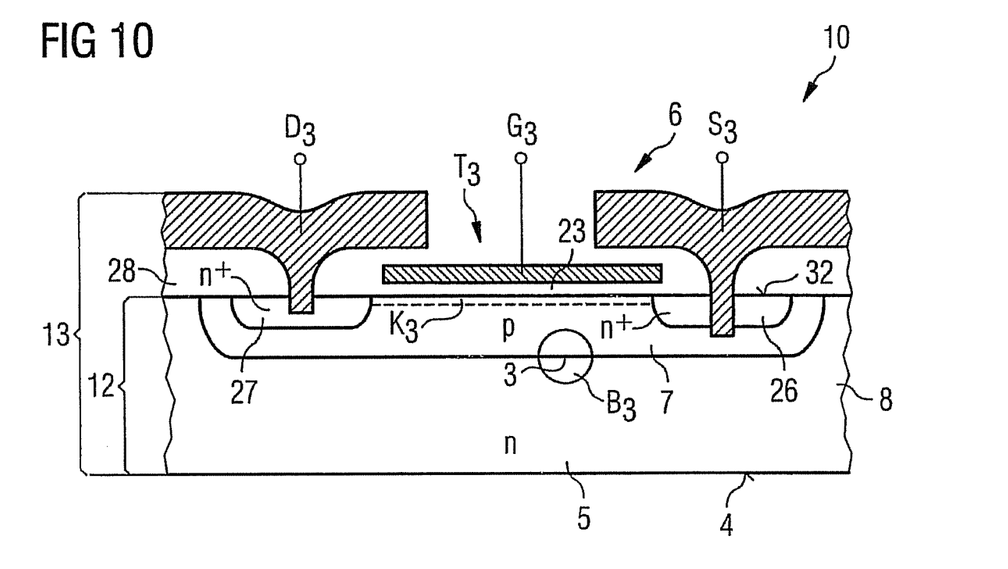
FIG. 10 illustrates a diagrammatic cross-section through a switchable element of a semiconductor device arrangement according to one embodiment.

In a further possible variant, the driver circuit 18 would after turn-off, i.e. when the driver output 17 switches to zero, output a further positive signal to connect the connecting point H to the source S by triggering a switchable element 2. Such a signal may remain positive for a fixed time or be held at a positive level by the actual gate characteristic. The switchable element of a corresponding semiconductor structure is illustrated in the following figure.

FIG. 10 is a diagrammatic cross-section through a switchable element 6 of a semiconductor component arrangement 6 of a semiconductor device 10 according to one embodiment. This switchable element 6 includes an n-channel field effect transistor $T_3$ with a channel $K_3$, a gate $G_3$, a drain $D_3$ and a source $S_3$. While the drain $D_3$ contacts a highly doped $n^+$-type drain zone 27, the source $S_3$ contacts both an $n^+$-type source zone 26 and a p-type base zone 31. If a positive potential is applied to $G_3$, the p-type base zone 31 forms an n-type channel $K_3$ in the p-type well 7 below the gate oxide 23. The p-type well 7 is insulated against the surrounding n-type semiconductor material 8 of the switchable element 6 via a body diode $B_3$ of a p-n junction 3.

To create a temporary short-circuit between the connecting point H of a power transistor and its source as illustrated in FIG. 1 in the turn-off phase of the power transistor, a positive signal is applied to the gate $G_3$ of the switchable element 6. For this purpose, the drain $D_3$ of the power transistor $T_H$ is electrically connected to the connecting point, while the source $S_3$ is connected to the source S of the power transistor $T_H$.

As explained above, the driver circuit of the power transistor $T_H$ has, to achieve this, to output a further positive signal in the turn-off phase, which is connected to the gate $G_3$ with the switchable element 6 illustrated in FIG. 4. Such a switchable element 6 in the driver circuit of the power transistor $T_H$ can be located monolithically on the semiconductor chip of the power transistor, monolithic integration being possible both for lateral MOSFETs and for vertical MOSFETs.

The gate $G_3$ is externally accessible, a complementary driver pulse controlling the gate $G_3$ such that the switchable element 6 for the semiconductor device arrangement 10 bridges the inductances between the connecting point H and the source of the power transistor $T_H$ at a steep switching edge. For this purpose, a p-type well 7 of the switchable element 6 is provided in an n-type semiconductor material 8 of the semiconductor body 12 of the semiconductor chip 13.

After such a MOSFET T3 has been produced in a semiconductor body 12, its drain $D_3$ is electrically connected to the connecting point H of the power transistor, its source $S_3$ to the source S of the power transistor $T_H$ and its gate $G_3$ to a driver output which supplies a complementary switching signal if there is a steep turn-off edge at the gate G.

Figure 11:
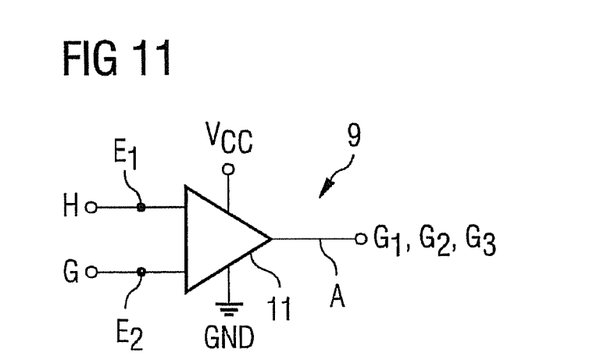
FIG. 11 illustrates an operational amplifier as a further switchable element of one embodiment.

In one embodiment, the voltage differential across the gate resistor $R_G$ between the gate and the connecting point H is evaluated by an operational amplifier 11 acting as a switchable element 9 as illustrated in FIG. 11. The operational amplifier 11 generates an amplified signal if the potential at the gate is higher than at the connecting point H. This occurs whenever the power transistor is in a turn-off phase. The operational amplifier 11 then outputs a positive amplified signal at its output A, wherein a structure according to FIG. 4 can once again be connected to the output A. This signal is used to connect the connecting point H to the source S of the power transistor $T_H$ illustrated in FIG. 1. For this purpose, the operational amplifier 11 may either be mounted as a semiconductor device on the semiconductor chip or fitted to the semiconductor chip of the control IC.

Figure 12:
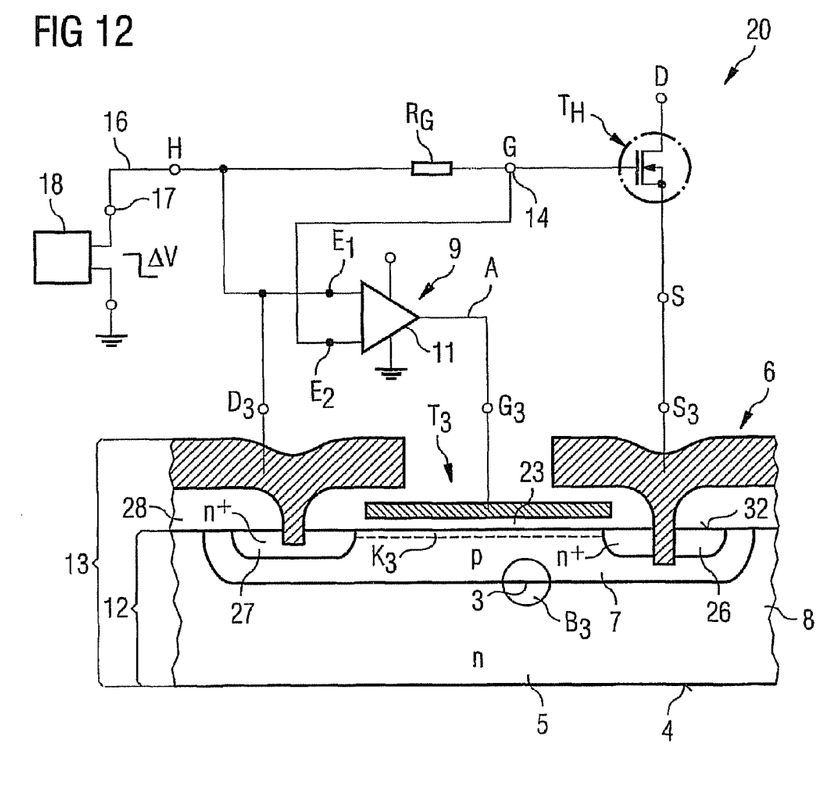
FIG. 12 illustrates a schematic sketch of a semiconductor device arrangement according to one embodiment.

FIG. 12 is a schematic diagram of a semiconductor device arrangement 20 according to one embodiment. Components of the same function as in the preceding figures are identified by the same reference numbers and not explained again. In this embodiment of the invention, an operational amplifier 11 as briefly mentioned above is used to utilize the voltage differential across the gate resistor $R_G$ and apply it to the inputs $E_1$ and $E_2$ of the operational amplifier 11. For this purpose, the connecting point H is connected to the first input $E_1$ of the operational amplifier 11 and the gate G of the power transistor $T_H$ is connected to the second input E2 of the operational amplifier 11.

The amplified output signal A is used to drive the gate $G_3$ as illustrated in FIG. 4 and to connect the connecting point H of the power transistor $T_H$ to the source S of the power transistor $T_H$, thus short-circuiting all inductances between the connecting point H and the source S of the power transistor $T_H$ in the turn-off phase of the power transistor $T_H$. For this purpose, the connecting point H is connected to the drain $D_3$ of the transistor $T_3$ and the source S of the power transistor $T_H$ is connected to the source $S_3$ of the transistor $T_3$ of the switchable element 6.

Although specific embodiments have been illustrated and described herein, it will be appreciated by those of ordinary skill in the art that a variety of alternate and/or equivalent implementations may be substituted for the specific embodiments shown and described without departing from the scope of the present invention. This application is intended to cover any adaptations or variations of the specific embodiments discussed herein. Therefore, it is intended that this invention be limited only by the claims and the equivalents thereof.

What is claimed is:

1. A semiconductor device comprising:
a power transistor;
a gate resistor connected between a gate of the power transistor and a connecting point in a drive circuit of the power transistor,
a switchable element connected between the connecting point and a source of the power transistor,
wherein the switchable element comprises two transistors having a common gate electrically connected to the gate of the power transistor and body zones which are arranged such that they block anti-serially, and
wherein the drains of the two transistors form a common node,
the switchable element being configured such that when the power transistor is
in a turn-on state, a voltage value of the connecting point is high, a voltage value at the gate is low and the switchable element is off,
in an on-state, the voltage value of the connecting point is high, the voltage value at the gate is high and the switchable element is off,
in a turn-off state, the voltage value of the connecting point is low, the voltage value at the gate is high and the switchable element is on, and
in an off-state, the voltage value of the connecting point is low, the voltage value at the gate is low and the switchable element is on.

2. The semiconductor device of claim 1, wherein the switchable element is installed as a monolithically integrated component into a lateral field effect power transistor.

* * * * *